United States Patent
Bear et al.

(10) Patent No.: US 11,984,512 B2
(45) Date of Patent: May 14, 2024

(54) MEMORY STRUCTURE FOR SELF-ERASING SECRET STORAGE

(71) Applicant: Intel Corporation, Santa Clara, CA (US)

(72) Inventors: Uri Bear, Pardes-Hana (IL); Elad Peer, Yokneam Ilit (IL); Elena Sidorov, Haifa (IL); Rami Sudai, Haifa (IL); Reuven Elbaum, Haifa (IL); Steve J. Brown, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/033,444

(22) Filed: Sep. 25, 2020

(65) Prior Publication Data
US 2021/0020775 A1    Jan. 21, 2021

(51) Int. Cl.
*H01L 29/788* (2006.01)
*G11C 16/04* (2006.01)
*H01L 29/423* (2006.01)
*H01L 29/66* (2006.01)
*H10B 41/00* (2023.01)
*H10B 43/00* (2023.01)

(52) U.S. Cl.
CPC ........ *H01L 29/788* (2013.01); *G11C 16/0408* (2013.01); *H01L 29/42324* (2013.01); *H01L 29/66825* (2013.01); *H10B 41/00* (2023.02); *H10B 43/00* (2023.02)

(58) Field of Classification Search
CPC .. H01L 27/112–11597; H01L 2924/145–1453; G11C 1317/02–126; H10B 41/00; H10B 20/00–10; H10B 20/27–50; H10B 43/00
See application file for complete search history.

(56) References Cited

U.S. PATENT DOCUMENTS

2004/0233727 A1* 11/2004 Iwase ................. G11C 16/3459
257/E21.21
2016/0086670 A1† 3/2016 Gross

OTHER PUBLICATIONS

"Floating-gate MOSFET," Wikipedia; retrieved Jan. 28, 2021 from https://en.wikipedia.org/wiki/Floating-gate_MOSFET (5 pgs.).

* cited by examiner
† cited by third party

*Primary Examiner* — Laura M Menz
*Assistant Examiner* — Candice Chan
(74) *Attorney, Agent, or Firm* — JAFFERY WATSON MENDONSA & HAMILTON LLP

(57) ABSTRACT

In one embodiment, memory cell includes a control gate, a floating gate, a substrate comprising a source region and a drain region, a first isolator between the control gate and floating gate, and a second isolator between the floating gate and the substrate. The memory cell is configured to have a retention time that is within a statistical window around a selected lifespan. The selected lifespan may be less than ten years, such as, for example, less than one year, less than one month, or less than one week.

10 Claims, 5 Drawing Sheets

MEMORY STRUCTURE FOR SELF-ERASING SECRET STORAGE

TECHNICAL FIELD

This disclosure relates in general to the field of computer systems and, more particularly, to a memory structure for self-erasing secret storage.

BACKGROUND

Current memory structures may be divided into one of two categories: volatile and non-volatile memory structures. Non-volatile memory structures may provide permanent (or effectively permanent) data storage, while volatile memory structures may provide temporary storage of data as power must be applied to the device to maintain the data in the memory structure. Flash memory is a type of memory typically considered to be a non-volatile memory structure. Today, it is common to store secrets (e.g. encryption keys, personally identifiable information (PII), configuration, etc.) on an Integrated Circuit (IC) for an extended amount of time using non-volatile storage elements. This, however, creates an opportunity for an adversary to extract the secrets when the device is powered off using common reverse engineering or failure analysis techniques.

BRIEF DESCRIPTION OF THE DRAWINGS

Like reference numbers and designations in the various drawings indicate like elements.

DETAILED DESCRIPTION OF EXAMPLE EMBODIMENTS

Figure 1:
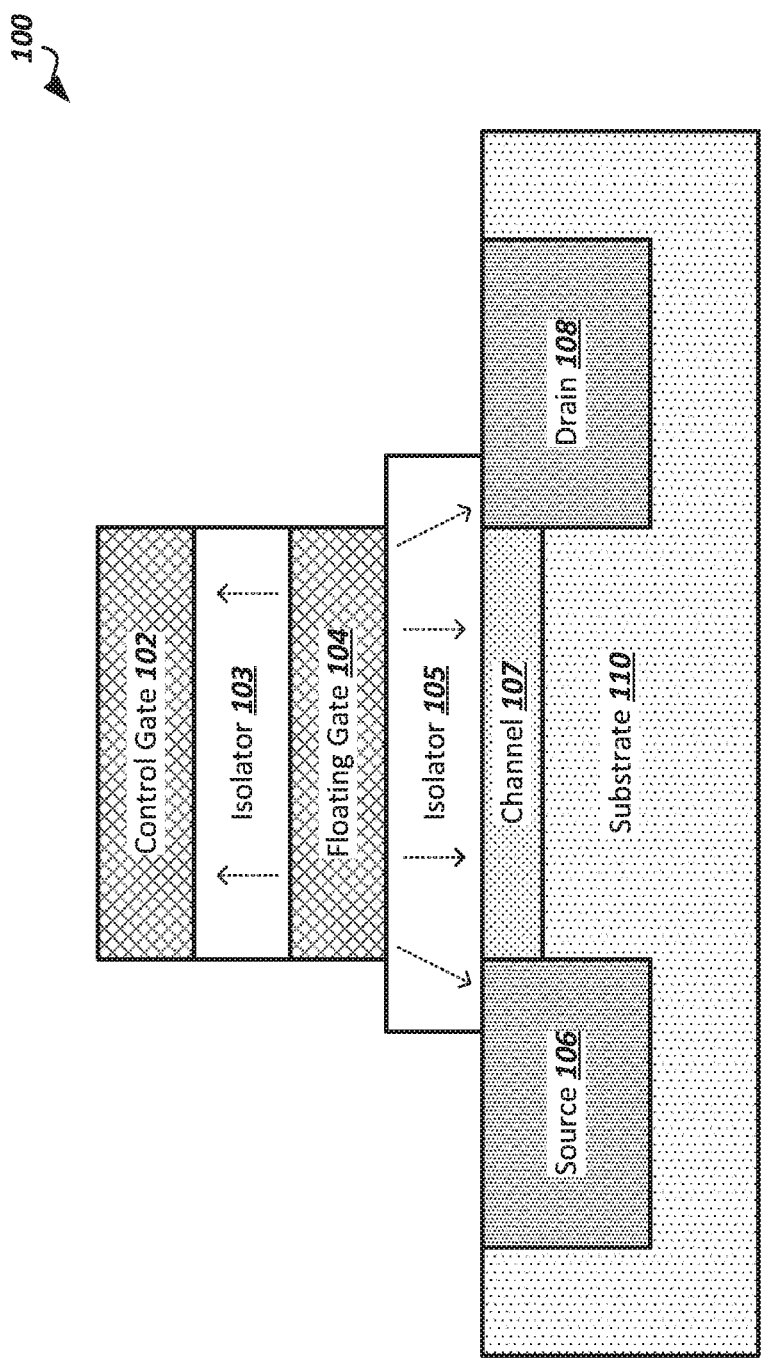
FIG. 1 illustrates a side view of an example floating-gate memory cell in accordance with one or more embodiments.

In the following description, numerous specific details are set forth, such as examples of specific configurations, structures, architectural details, etc. in order to provide a thorough understanding of the present disclosure. It will be apparent, however, to one skilled in the art that these specific details need not be employed to practice embodiments of the present disclosure. In some instances, well known components or methods may be utilized, and such details haven't been described in detail in order to avoid unnecessarily obscuring embodiments of the present disclosure.

Current memory structures may be divided into one of two categories: volatile and non-volatile memory structures. Non-volatile memory structures may provide permanent (or effectively permanent) data storage, while volatile memory structures may provide temporary storage of data as power must be applied to the device to maintain the data in the memory structure. For example, non-volatile memory structures may be used in read only memory (ROM), One Time Programmable (OTP) solutions such as fuses or anti-fuses, Multiple Time Solutions (MTP), and flash memory, and volatile memory structures may be used in random access memory (RAM) or registers.

Flash memory may utilize floating gate transistor-based memory cells, e.g., floating gate metal-oxide-semiconductor field-effect transistors (MOSFET), or memory cells that store charge in a sidewall spacer of a gate. While these memory cells may leak stored charge over time, they are considered to be non-volatile memory structures (for example, current floating gate MOSFET designs call for charge storage lifetimes, or retention times, on the order of 10 years or more). Accordingly, it may be common to store secrets (e.g. encryption keys, personally identifiable information (PII), configuration, etc.) on flash memory for an extended amount of time. Other systems, such as field-programmable gate array (FPGA) devices, may store keys in a dedicated Battery Backed RAM (BBRAM). This makes it harder for an attacker to disassemble the device to gain access to the secret, which remains alive only as long as the battery is active, preventing some known reverse engineering attacks. The commonality of the above solutions is that they favor persistent storage of the secret(s); however, they also provide one or more disadvantages and allow a reverse engineering adversary (who wishes to extract these values in order to decrypt secret data, forge IP's, copy the system and so on) to gain access to the secret(s) (e.g., when the device is powered off in the case of the non-volatile storage systems). Additionally, the BBRAM solution requires the usage of a battery and since the RAM circuit is always active, it drains the battery in a pre-calculated rate. An active circuit draws too much current and therefore the lifespan of the secret depends on the battery. Moreover, the lifespan can be extended against the wishes of the manufacturer by replacing an external battery or power supply. Further, the battery port may be accessible to an attacker and may be susceptible to attacks, such as power analysis and LASER scanning.

Accordingly, in some embodiments, a memory structure may be provided that is "semi-volatile" or semi-permanent in nature, i.e., it may be designed such that data stored thereon will expire after a pre-determined period of time, rendering reverse engineering techniques ineffective against extracting secrets and limiting attacks during off periods of the device. For example, some embodiments may utilize a floating gate memory cell that is similar to structures currently used in flash memory; however, the floating gate memory cell used in embodiments herein may be manufactured using modified parameters (e.g., oxide composition, quality, thickness, aging, etc.) that create a leaky gate oxide so that the charge stored in the floating gate (or sidewall oxide for sidewall storage-based memory cells) purposely leaks over time. The parameters may be chosen such that the floating gate leaks a particular amount, percentage, or other metric of charge over a predetermined amount of time. This in turn causes the data stored on the memory cell to become volatile and self-erase after the pre-determined amount of time.

The proposed enhancement of the volatility is anti-intuitive to current manufacturing techniques and theory, as memory cell designers (especially those designing floating gate memory cells) strive to minimize the leakage of charge from the floating gate. That is, the designers strive to maximize the amount of time that data will be stored in the memory cell, whereas embodiments herein may be designed to purposely leak charge over time such that the data stored on the memory cell is no longer accessible after a predetermined amount of time. As an example, current designs are specified to have retention times on the order of 10 years or more.

Embodiments of the present disclosure may provide one or more advantages over existing memory structures. For example, some embodiments, may serve to add a complexity layer to reverse engineering attacks, providing defense-in-depth benefits and hindering common reverse engineering techniques being applied against present-day flash designs. As another example, some embodiments, may enables an on-die time dependent storage of keys and information, allowing the definition of an "expiration time" to self-erase the secrets. As another example, some embodiments, may provide increased resistance to reverse engineering attacks on storage devices, e.g., those using electron beam or LASER probing & power analysis. As yet another example, some embodiments, may draw no current during off periods, conserving energy. Further, if desired, embodiments may allow for the data preservation period may be extended by a short refresh cycle executed prior to end of the predetermined leakage period. As yet another example, some embodiments may enable advanced use cases, such as physically unclonable functions (PUFs), which are described further below.

FIG. 1 illustrates a side view of an example floating-gate memory cell 100 in accordance with one or more embodiments. The example memory cell 100 may be utilized in any suitable memory structure or apparatus. For example, the memory cell 100 may be incorporated into standalone flash memory devices or apparatuses, or on-chip with other computing components such as processors (e.g., as part of a memory structure in a system-on-chip (SoC) device). Although illustrated in FIG. 1 as being constructed in a particular manner, it will be understood that a memory structure according to the present disclosure may be constructed in another manner than that shown (e.g., different relative thicknesses, etc.).

In the example shown, the memory cell 100 includes a control gate 102 and floating gate 104, which are separated by an isolator 103. The example memory cell 100 also includes a substrate 110 with source 106 and drain 108. An isolator 105 is disposed between the floating gate 104 and top surfaces of the substrate 110, source 106, and drain 108. The substrate 110 may be any suitable semiconductor material, such as silicon, that is doped with (e.g., Boron, Aluminum, Gallium, or Indium (or a combination thereof) for p-type doping, Phosphorous, Arsenic, Antimony, Bismuth, Lithium (or a combination thereof) for n-type doping), while the source 106 and drain 108 may be regions of the substrate 110 that are doped with another material of the opposite polarity. That is, in some embodiments, the substrate 110 may be p-type doped and the source 106 and drain 108 are n-type doped. In other embodiments, the substrate 110 may be n-type doped and the source 106 and drain 108 are p-type doped. The control gate 102 and floating gate 104 may be made of a conductive material, while the isolators 103, 105 may be made of a dielectric material to prevent the flow or leakage of charge through the isolators (example leakage paths are shown in FIG. 1 by the dotted arrow lines). In some embodiments, the isolators 103, 105 may be composed of an oxide material, with the isolator 103 being referred to as a control oxide and the isolator 105 being referred to as a tunnel oxide.

The example memory cell 100 may store data over time by trapping charge in the floating gate 104. When the control gate 102 is enabled (e.g., voltage applied), charge flows under the gate structure and the gate voltage causes some of the charge to change its direction and flow into the floating gate 104. Since the floating gate 104 is isolated by isolators 103, 105, the charge effectively does not escape when the gate voltage is turned off and it subsequently changes the conductance of the transistor in a measurable way, thus providing a permanent storage capability. The charge storage capability is thus dependent on the quality of the isolation qualities of the isolators 103, 105 surrounding the floating gate 104. In current systems, the manufacturing process is tailored towards making the isolators 103, 105 provide the best quality of isolation, which translates into a longer lifetime of the stored data.

However, embodiments of the present disclosure may include isolators 103, 105 that are designed such that charge stored in the floating gate 104 will expire after a predetermined period of time. For example, the floating gate 104 may be manufactured using modified parameters (e.g., oxide composition, quality, thickness, aging, etc.) that create a leaky environment so that the charge stored in the floating gate leaks over a certain amount of time. The parameters may be tuned or chosen based on a predetermined expiration time for the charge storage. That is, the parameters may be chosen such that the floating gate leaks a particular amount, percentage, or other metric of charge over a predetermined amount of time. In this way, the memory cell may have a calculable lifetime of data stored thereon. The charge leakage may occur from the floating gate 104 to one or more of the control gate 102, to the source 106, to the drain 108, or to the channel/depletion region 107 in the substrate 110 between the source 106 and drain 108.

Some example parameters that may be modified in the manufacture of a memory cell to realize embodiments of the present disclosure include one or more of the following. For example, in some embodiments, the parameters of the memory cell (e.g., of the isolators 103, 105) may be chosen such that the functional life of the memory cell is on the order of days, weeks, months, or a few years, as compared with current non-volatile memory cells that have functional lifespans on the order of 10 years or more. As one example, "low-quality" oxide isolation may be provided by tuning (e.g., lowering) the temperature in which the oxidation process for the isolators 103, 105 takes place during manufacturing, or by changing the dopants or other materials used in their manufacture. For example, low-k dielectrics that are known to have reliability issues with time dependent breakdown may be used, e.g., Porous dielectrics—Porous Silicate/Organo-Silicate Glass, Porous Organics polymers, Porous oxide; Doped oxides—H, F, C doped silicon oxide; and Organic polymers—Teflon, polyimide, parylene.

As another example, the memory cell structure may be intentionally stressed during manufacture, e.g., by applying cycles of high voltage at burn-in, which may cause the isolation properties of the isolator material to be reduced. As yet another example, some embodiments may modify the thickness of the isolator 103, isolator 105, or both so the naturally occurring tunneling current is increased. Other manners of manufacturing a memory cell in accordance with the present disclosure may include modifying properties of the channel between the source 106 and drain 108 (e.g., by adding/removing dopants in the channel region between the source and drain).

It will be understood that other structures may be utilized in accordance with embodiments of the present disclosure. For example, in some embodiments, the memory cell may store the information in charges trapped in the sidewall or another location. As another example, suitable leakage paths may be selected that can cause a cell to discharge or even charge at will. As another example, in some embodiments, the isolators 103, 105 are integrated with one another. Moreover, although the present disclosure describes embodiments that include or utilize floating gate memory cells, aspects of the present disclosure may be applied to other types of memory cells that store charge to indicate data, where the memory cell leaks the stored charge over time. For example, certain embodiments may implement aspects of the present disclosure in sidewall storage-based memory cells rather than floating gate-based memory cells such as memory cell 100.

Figure 2:
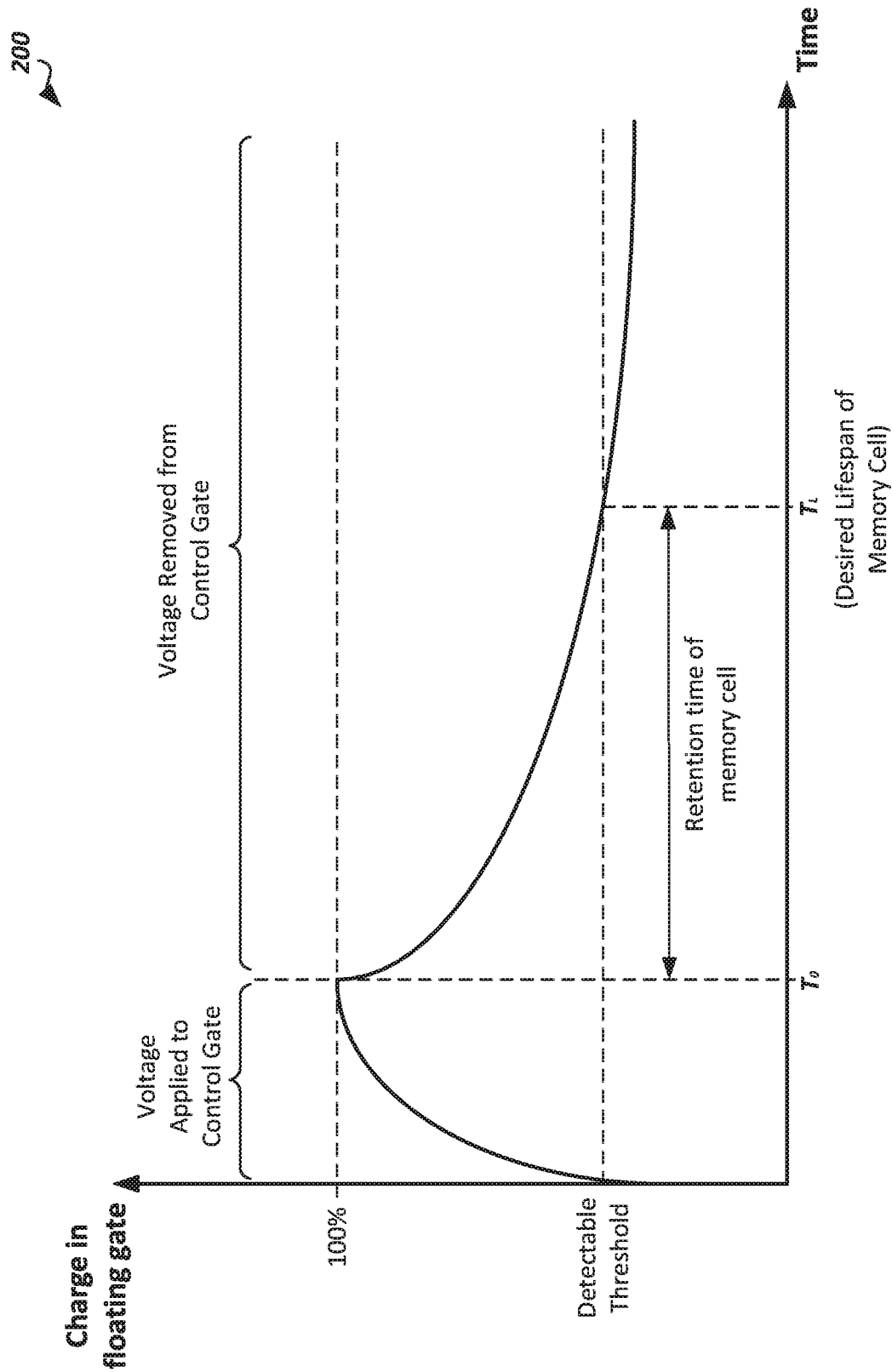
FIG. 2 is a chart illustrating the retention time of a memory cell in accordance with embodiments of the present disclosure.

FIG. 2 is a chart 200 illustrating the retention time of a memory cell in accordance with embodiments of the present disclosure (e.g., the memory cell 100 of FIG. 1). In the following discussion, reference is made to components of the example memory cell 100 of FIG. 1. However, it will be understood that the concepts described may be applicable to other types of memory structures that are semi-volatile in accordance with the present disclosure (e.g., memory cells designed to have functional lifespans on the order of days, weeks, or months).

In the example shown, a voltage is first applied to the control gate of the memory cell (e.g., 102) to charge the floating gate (e.g., 104) to 100% (or near 100%) capacity. The floating gate stores the charge to indicate some data, e.g., a 0 or 1 for a bit of data. The voltage is then removed at a time $T_0$ and the charge in the floating gate slowly leaks over time, as shown. Eventually, the amount of charge in the floating gate will reduce to an amount that is at a detectable threshold level, i.e., a level below which a bit stored by the memory cell might not be accurately or reliably read. This discharge time may be referred to as the functional life/lifespan of the memory cell, or in some instances, as the retention time of the memory cell. In current systems, the retention time may be on the order of 10 years or more, and properties of the memory cell may be chosen such that the retention time of the memory cell is maximized.

However, in embodiments of the present disclosure, one or more properties of the memory cell (e.g., of isolators 103, 105) may be selected or tuned such that the retention time of the memory cell is within a certain window of time around a desired lifespan $T_L$. That is, the memory cell may be designed with a predetermined retention time in mind (e.g., on the order of days, weeks, or months), and the properties of the memory cell may be selected such that the actual retention time of the memory cells produced using those properties will fall approximately around the desired lifespan $T_L$ (i.e., the retention times will statistically fall within a window surrounding $T_L$).

Some example use cases of a semi-volatile memory structures such as memory cell 100 are described below. In the following examples, the time calculated for the charge in the storage element (e.g., floating gate 104) to leak below a detectable level is referred to as the "functional life" due to the statistical nature of this phenomena.

Expiring Data

In this example use case, a user is interested in deploying a system and wants to build in an "expiration date" for the system, even if no power is applied to the system. For example, a weapon system may be provided to a friendly party that may still be untrustworthy. If a short functional life is selected for the memory in the system (which may store, for example, security codes for the weapon), the system may be forced to "check in" from time to time to continue proper functioning. If a longer functional life is selected, it may still force a renewal of the "loan" but allows a reasonable functionality period between renewals.

BBRAM Extension

In this example use case, the Battery Backed RAM (BBRAM) cells that store the secret are replaced with a memory cell structure (e.g., flash memory cell) with a short functional life as described herein. This may allow for extended storage times by selecting a short functional life while periodically required the application of power to the system to perform a refresh cycle where cells are read and re-written. This may be triggered in some instances by powering up an external pin (e.g., applying a voltage to the pin).

PUF Structure

In this example use case, a collection of memory cells having a short functional life as described herein may be used to provide a PUF value. For example, the memory cells may be set to an initial value (IV) and left to decay (discharge) for a pre-chosen period of time, e.g., until half the cells hold a logic one and half are zero. This value may now serve as the PUF value. The memory cells may be refreshed at appropriate intervals for future usage.

Figure 3:
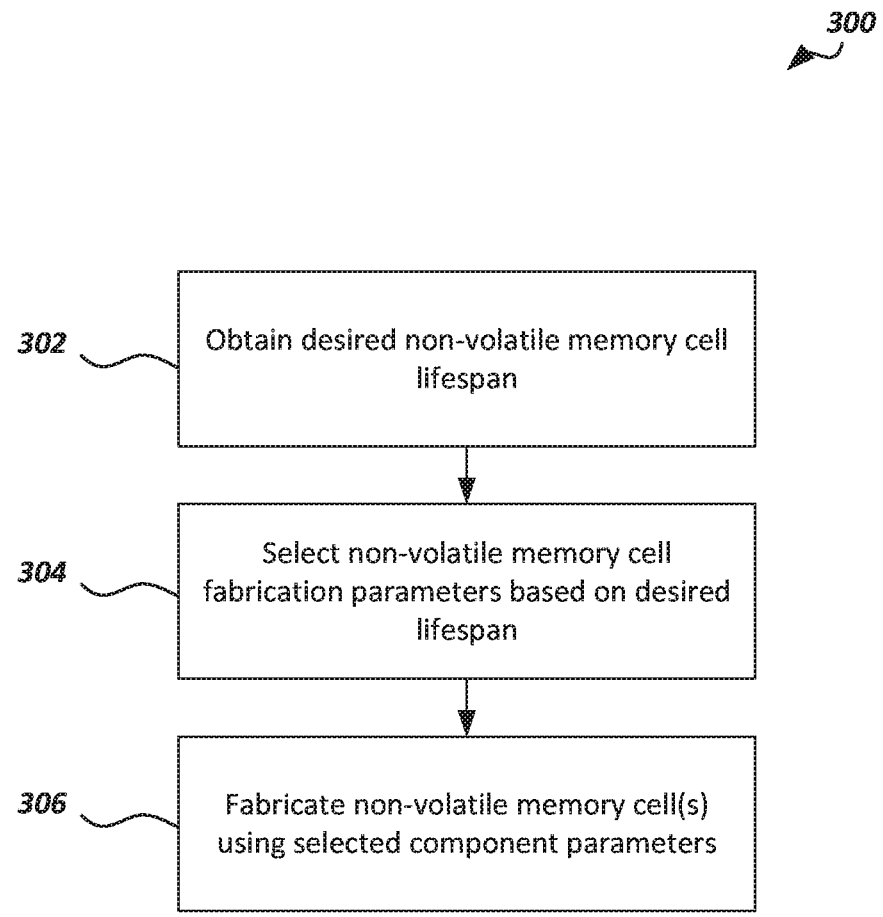
FIG. 3 illustrates an example flow diagram of a process of designing and fabricating a non-volatile memory cell in accordance with embodiments of the present disclosure.

FIG. 3 illustrates an example flow diagram of a process 300 of designing and fabricating a non-volatile memory cell in accordance with embodiments of the present disclosure. The non-volatile memory cell may be, for example, a floating gate-based memory cell or a sidewall storage-based memory cell. The example process may include additional or different operations, and the operations may be performed in the order shown or in another order. In some cases, one or more of the operations shown in FIG. 3 are implemented as processes that include multiple operations, sub-processes, or other types of routines. In some cases, operations can be combined, performed in another order, performed in parallel, iterated, or otherwise repeated or performed another manner.

At 302, a selected lifespan for a non-volatile memory cell is obtained, and at 304, one or more fabrication parameters for the non-volatile memory cell are selected based on the selected lifespan. The selected lifespan may relate to a selection of a retention time for the memory cell, as described above. At 306, a non-volatile memory cell (e.g., memory cell 100 or a similar memory cell structure) is manufactured based on the selected fabrication parameters.

In some embodiments, the selected lifespan is less than ten years (whereas, current systems may implement retention times of greater than ten years), such as, for example, less than one year, less than one month, or less than one week. The selected fabrication parameters may be used in the manufacturing process to produce memory cells that are configured to have a retention time that is within a statistical window around the selected lifespan (e.g., +/−5% of the selected lifespan, or between 95% of the selected lifespan and 105% of the selected lifespan).

In embodiments where the non-volatile memory cell is a floating gate-based memory cell, the fabrication parameters may include parameters for at least one of a tunnel oxide layer (e.g., isolator 105 of FIG. 1) and a control oxide layer (e.g., isolator 103 of FIG. 1) of the floating gate memory cell. For example, the parameters may include an oxide layer thickness or material composition selection for the tunnel oxide layer or control oxide layer. In some embodiments, the fabrication parameters are parameters for a channel between a source region and drain region in a substrate of the floating gate memory cell. For example, the channel parameters may indicate a doping amount or material to be used to form the channel between the source and drain regions. In some embodiments, the fabrication parameters are parameters for a temperature or pressure for the manufacturing of the floating gate memory cell. For example, the component parameters may indicate a temperature at which the oxidation occurs in the manufacturing of the floating gate memory cell (e.g., for one or both of the tunnel oxide or control oxide layers). In some embodiments, the manufacturing of the floating gate memory cell includes stressing the floating gate memory cell. For example, the manufacturing process may include applying cycles of high voltage to a control gate of the floating gate memory cell. Other fabrication parameters may be selected at 304 than those described above.

In some embodiments, one or more of the operations (and any sub-operations thereof) may be implemented as instructions embodied in a non-transitory computer-readable medium. For instance, one or more aspects of the operations related to 304 may be performed by a computer program based providing the selected lifespan as an input variable. As an example, the selected lifespan may be provided as an input to modeling software (e.g., along with other design parameters, e.g., overall thickness or other dimensional parameters, material choices for the oxide layers, etc.). The modeling software may determine and output a set of fabrication parameters based on the selected lifespan and any other input parameters. In some instances, the modeling software may be implemented by a trained neural network. The fabrication parameters output by the software may be provided to fabrication software that controls the fabrication process based on the fabrication parameters. In some cases, one or more output parameters may be used in post-fabrication steps, such as stressing the fabricated memory cells for a certain number or type of write cycles, erase cycles, thermal cycles, and/or voltage cycles.

Figure 4:
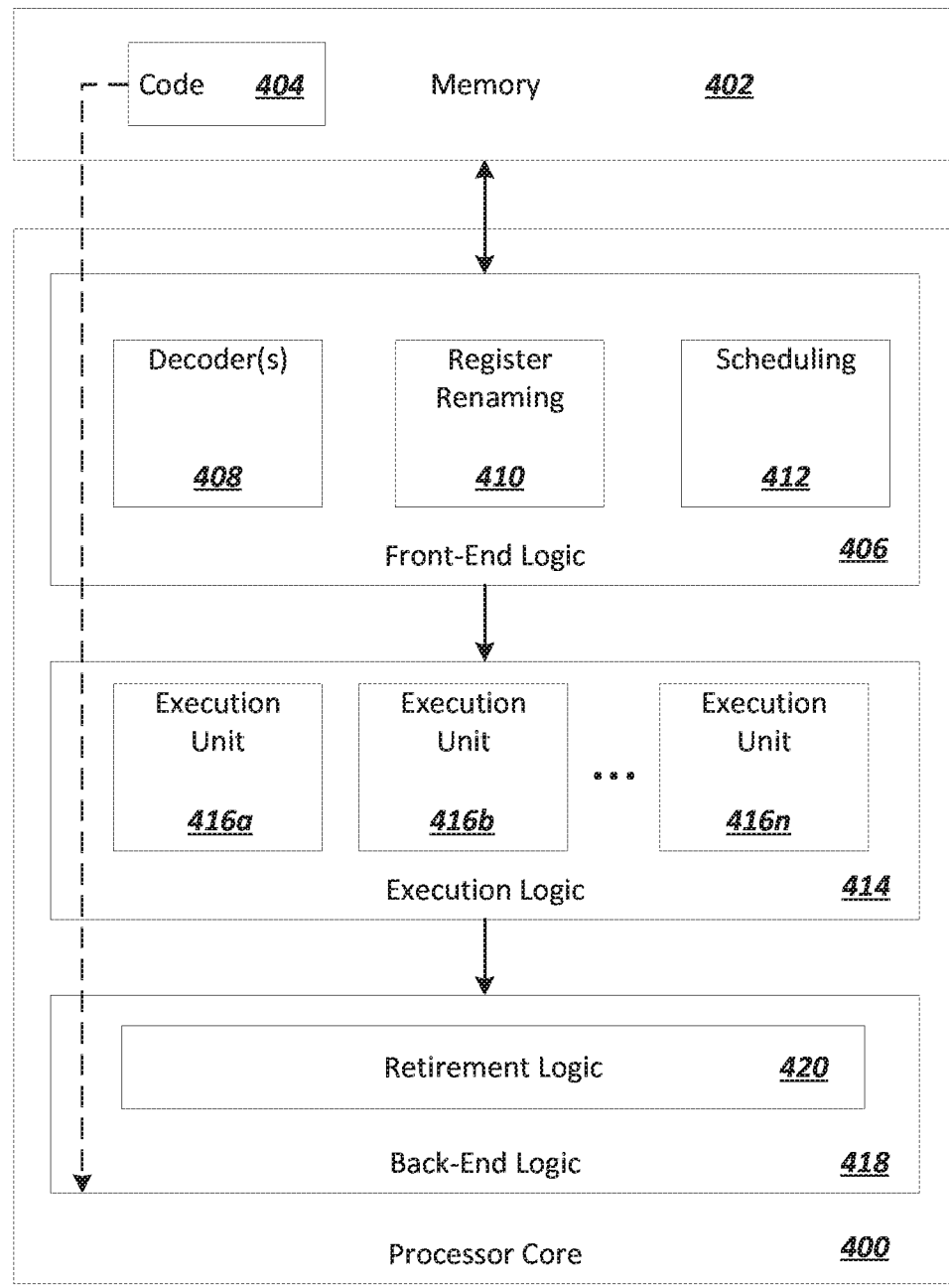
FIG. 4 is an example illustration of a processor according to an embodiment.
Figure 5:
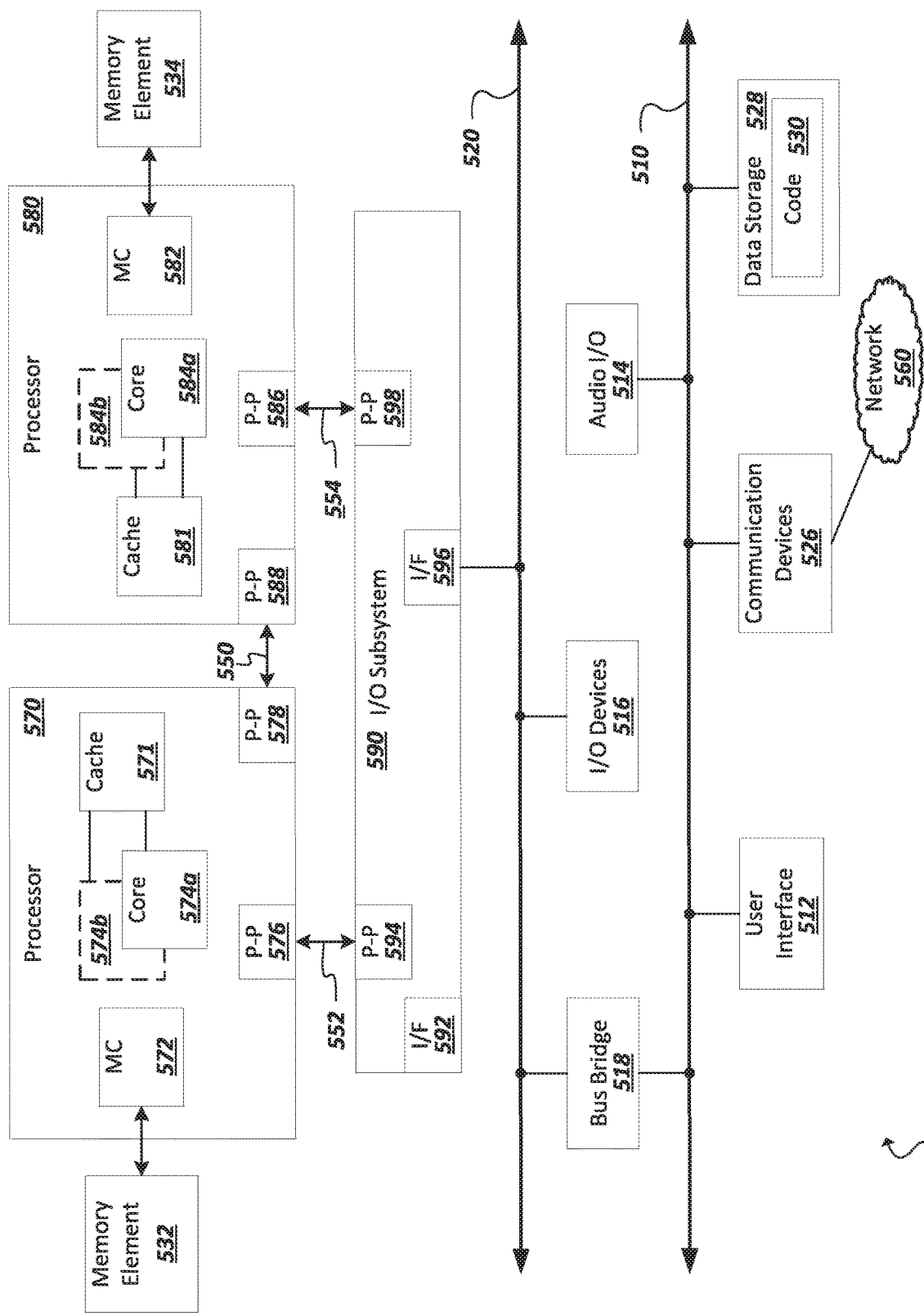
FIG. 5 illustrates a computing system that is arranged in a point-to-point (PtP) configuration according to an embodiment.

FIGS. 4-5 are block diagrams of example computer architectures that may be used in accordance with embodiments disclosed herein. For example, in some embodiments, a memory structure in accordance with embodiments of the present disclosure may be incorporated in a computing device containing one or more aspects shown in FIGS. 4-5 (e.g., the processor core 400 of FIG. 4 or one or both of processors 570, 580 of FIG. 5). For example, in some cases, a floating gate memory cell with a selected lifespan may be incorporated into a flash memory device, which may be utilized in the memory 402 of FIG. 4 or memory elements 532, 534 or data storage 528 of FIG. 5. Other computer architecture designs known in the art for processors and computing systems may also be used. Generally, suitable computer architectures for embodiments disclosed herein can include, but are not limited to, configurations illustrated in FIGS. 4-5.

FIG. 4 is an example illustration of a processor according to an embodiment. Processor 400 is an example of a type of hardware device that can be used in connection with the implementations above. Processor 400 may be any type of processor, such as a microprocessor, an embedded processor, a digital signal processor (DSP), a network processor, a multi-core processor, a single core processor, or other device to execute code. Although only one processor 400 is illustrated in FIG. 4, a processing element may alternatively include more than one of processor 400 illustrated in FIG. 4. Processor 400 may be a single-threaded core or, for at least one embodiment, the processor 400 may be multi-threaded in that it may include more than one hardware thread context (or "logical processor") per core.

FIG. 4 also illustrates a memory 402 coupled to processor 400 in accordance with an embodiment. Memory 402 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 400 can execute any type of instructions associated with algorithms, processes, or operations detailed herein. Generally, processor 400 can transform an element or an article (e.g., data) from one state or thing to another state or thing.

Code 404, which may be one or more instructions to be executed by processor 400, may be stored in memory 402, or may be stored in software, hardware, firmware, or any suitable combination thereof, or in any other internal or external component, device, element, or object where appropriate and based on particular needs. In one example, processor 400 can follow a program sequence of instructions indicated by code 404. Each instruction enters a front-end logic 406 and is processed by one or more decoders 408. The decoder may generate, as its output, a micro operation such as a fixed width micro operation in a predefined format, or may generate other instructions, microinstructions, or control signals that reflect the original code instruction. Front-end logic 406 also includes register renaming logic 410 and scheduling logic 412, which generally allocate resources and queue the operation corresponding to the instruction for execution.

Processor 400 can also include execution logic 414 having a set of execution units 416a, 416b, 416n, etc. Some embodiments may include a number of execution units dedicated to specific functions or sets of functions. Other embodiments may include only one execution unit or one execution unit that can perform a particular function. Execution logic 414 performs the operations specified by code instructions.

After completion of execution of the operations specified by the code instructions, back-end logic 418 can retire the instructions of code 404. In one embodiment, processor 400 allows out of order execution but requires in order retirement of instructions. Retirement logic 420 may take a variety of known forms (e.g., re-order buffers or the like). In this manner, processor 400 is transformed during execution of code 404, at least in terms of the output generated by the decoder, hardware registers and tables utilized by register renaming logic 410, and any registers (not shown) modified by execution logic 414.

Although not shown in FIG. 4, a processing element may include other elements on a chip with processor 400. For example, a processing element may include memory control logic along with processor 400. The processing element may include I/O control logic and/or may include I/O control logic integrated with memory control logic. The processing element may also include one or more caches. In some embodiments, non-volatile memory (such as flash memory or fuses) may also be included on the chip with processor 400.

FIG. 5 illustrates a computing system 500 that is arranged in a point-to-point (PtP) configuration according to an embodiment. In particular, FIG. 5 shows a system where processors, memory, and input/output devices are interconnected by a number of point-to-point interfaces. Generally, one or more of the computing systems described herein may be configured in the same or similar manner as computing system 400.

Processors 570 and 580 may also each include integrated memory controller logic (MC) 572 and 582 to communicate with memory elements 532 and 534. In alternative embodiments, memory controller logic 572 and 582 may be discrete logic separate from processors 570 and 580. Memory elements 532 and/or 534 may store various data to be used by processors 570 and 580 in achieving operations and functionality outlined herein.

Processors 570 and 580 may be any type of processor, such as those discussed in connection with other figures. Processors 570 and 580 may exchange data via a point-to-point (PtP) interface 550 using point-to-point interface circuits 578 and 588, respectively. Processors 570 and 580 may each exchange data with a chipset 590 via individual point-to-point interfaces 552 and 554 using point-to-point interface circuits 576, 586, 594, and 598. Chipset 590 may also exchange data with a co-processor 538, such as a high-performance graphics circuit, machine learning accelerator, or other co-processor 538, via an interface, which could be a PtP interface circuit. In alternative embodiments, any or all of the PtP links illustrated in FIG. 5 could be implemented as a multi-drop bus rather than a PtP link.

Chipset 590 may be in communication with a bus 520 via an interface circuit 596. Bus 520 may have one or more devices that communicate over it, such as a bus bridge 518 and I/O devices 516. Via a bus 510, bus bridge 518 may be in communication with other devices such as a user interface 512 (such as a keyboard, mouse, touchscreen, or other input devices), communication devices 526 (such as modems, network interface devices, or other types of communication devices that may communicate through a computer network 560), audio I/O devices 514, and/or a data storage device 528. Data storage device 528 may store code 530, which may be executed by processors 570 and/or 580. In alternative embodiments, any portions of the bus architectures could be implemented with one or more PtP links.

The computer system depicted in FIG. 5 is a schematic illustration of an embodiment of a computing system that may be utilized to implement various embodiments discussed herein. It will be appreciated that various components of the system depicted in FIG. 5 may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

Further, it should be appreciated that the examples presented above are non-limiting examples provided merely for purposes of illustrating certain principles and features and not necessarily limiting or constraining the potential embodiments of the concepts described herein. For instance, a variety of different embodiments can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

These and other embodiments can each optionally include one or more of the following features. The features identified for each of the functions can be combined to generate a consolidated string for the sample and the feature set can be generated from the consolidated string. A string can be generated for each of the functions, each string describing the respective features identified for the function. Combining the features can include identifying a call in a particular one of the plurality of functions to another one of the plurality of functions and replacing a portion of the string of the particular function referencing the other function with contents of the string of the other function. Identifying the features can include abstracting each of the strings of the functions such that only features of the set of control flow fragment types are described in the strings. The set of control flow fragment types can include memory accesses by the function and function calls by the function. Identifying the features can include identifying instances of memory accesses by each of the functions and identifying instances of function calls by each of the functions. The feature set can identify each of the features identified for each of the functions. The feature set can be an n-graph.

Further, these and other embodiments can each optionally include one or more of the following features. The feature set can be provided for use in classifying the sample. For instance, classifying the sample can include clustering the sample with other samples based on corresponding features of the samples. Classifying the sample can further include determining a set of features relevant to a cluster of samples. Classifying the sample can also include determining whether to classify the sample as malware and/or determining whether the sample is likely one of one or more families of malware. Identifying the features can include abstracting each of the control flow graphs such that only features of the set of control flow fragment types are described in the control flow graphs. A plurality of samples can be received, including the sample. In some cases, the plurality of samples can be received from a plurality of sources. The feature set can identify a subset of features identified in the control flow graphs of the functions of the sample. The subset of features can correspond to memory accesses and function calls in the sample code.

While this specification contains many specific implementation details, these should not be construed as limitations on the scope of any embodiments or of what may be claimed, but rather as descriptions of features specific to particular embodiments of particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The following examples pertain to embodiments in accordance with this Specification. It will be understood that certain examples may be combined with certain other examples, in certain embodiments.

Example 1 includes a method comprising: obtaining a selected lifespan for a non-volatile memory cell; selecting one or more fabrication parameters for the non-volatile memory cell based on the selected lifespan; and fabricating a non-volatile memory cell based on the one or more selected fabrication parameters.

Example 2 includes the subject matter of Example 1 and/or other Example(s), and optionally, wherein the one or more fabrication parameters are parameters for at least one of a tunnel oxide layer and a control oxide layer of the non-volatile memory cell.

Example 3 includes the subject matter of Example 2 and/or other Example(s), and optionally, wherein the parameters comprise an oxide layer thickness for the tunnel oxide layer or control oxide layer.

Example 4 includes the subject matter of Example 2 and/or other Example(s), and optionally, wherein the parameters comprise an oxide material composition for the tunnel oxide layer or control oxide layer.

Example 5 includes the subject matter of any one of Examples 1-4 and/or other Example(s), and optionally, wherein the one or more fabrication parameters are parameters for a channel between a source region and drain region in a substrate of the non-volatile memory cell.

Example 6 includes the subject matter of any one of Examples 1-5 and/or other Example(s), and optionally, wherein the one or more fabrication parameters are parameters for a temperature or pressure for the fabricating of the non-volatile memory cell.

Example 7 includes the subject matter of Example 6 and/or other Example(s), and optionally, wherein the one or more fabrication parameters including a temperature at which an oxidation occurs in the fabricating of the non-volatile memory cell.

Example 8 includes the subject matter of any one of Examples 1-7 and/or other Example(s), and optionally, wherein further comprising stressing the non-volatile memory cell comprises stressing the non-volatile memory cell.

Example 9 includes the subject matter of any one of Examples 1-8 and/or other Example(s), and optionally, wherein stressing the non-volatile memory cell comprises applying cycles of high voltage to a control gate of the non-volatile memory cell.

Example 10 includes the subject matter of any one of Examples 1-9 and/or other Example(s), and optionally, wherein the non-volatile memory cell is to store a charge based on a control signal being applied thereto and leak the stored charge over time, and the selected lifespan of the non-volatile memory cell indicates an amount of time that the stored charge is detectable in the non-volatile memory cell.

Example 11 includes the subject matter of any one of Examples 1-10 and/or other Example(s), and optionally, wherein the non-volatile memory cell is one of a floating gate-based memory cell or a sidewall storage-based memory cell.

Example 12 includes a memory cell comprising: a control gate; a floating gate; a substrate comprising a source region and a drain region; a first isolator between the control gate and floating gate; and a second isolator between the floating gate and the substrate; wherein the memory cell is configured to have a retention time that is within a statistical window around a selected lifespan.

Example 13 includes the subject matter of Example 12 and/or other Example(s), and optionally, wherein the selected lifespan is less than ten years.

Example 14 includes the subject matter of Example 13 and/or other Example(s), and optionally, wherein the selected lifespan is less than one year.

Example 15 includes the subject matter of Example 13 and/or other Example(s), and optionally, wherein the selected lifespan is less than one month.

Example 16 includes the subject matter of Example 13 and/or other Example(s), and optionally, wherein the selected lifespan is less than one week.

Example 17 includes the subject matter of any one of Examples 12-16 and/or other Example(s), and optionally, wherein the statistical window is between 95% of the selected lifespan and 105% of the selected lifespan.

Example 18 includes the subject matter of any one of Examples 12-17 and/or other Example(s), and optionally, wherein the memory cell is to store a charge in the floating gate based on a control signal being applied to the control gate, the floating gate is to leak the stored charge over time, and the selected lifespan indicates an amount of time that the stored charge is detectable in the floating gate.

Example 19 includes a system comprising: a processor; and memory comprising at least one non-volatile memory cell that is configured to have a retention time that is within a statistical window around a selected lifespan.

Example 20 includes the subject matter of Example 19 and/or other Example(s), and optionally, wherein the selected lifespan is less than ten years, less than one year, less than one month, or less than one week.

Example 21 includes the subject matter of Example 19 or 20 and/or other Example(s), and optionally, wherein the statistical window is between 95% of the selected lifespan and 105% of the selected lifespan.

Example 22 includes the subject matter of any one of Examples 19-21 and/or other Example(s), and optionally, wherein the non-volatile memory cell is to store based on a control signal being applied thereto gate and is to leak the stored charge over time, and the selected lifespan indicates an amount of time that the stored charge is detectable in the non-volatile memory cell.

Example 23 includes the subject matter of any one of Examples 19-22 and/or other Example(s), and optionally, wherein the non-volatile memory cell comprises: a control gate; a floating gate; a substrate comprising a source region and a drain region; a first isolator between the control gate and floating gate; and a second isolator between the floating gate and the substrate.

Example 24 includes the subject matter of any one of Examples 19-23 and/or other Example(s), and optionally, wherein the memory comprises a flash memory device and the memory cell is integrated in the flash memory device.

Example 25 includes the subject matter of any one of Examples 19-24 and/or other Example(s), and optionally, wherein the system comprises a system-on-chip (SoC).

Example 26 includes one or more computer-readable media storing instructions that, when executed by a processor, are operable to implement any one of Examples 1-11.

Example 27 includes a product formed by a process comprising the operations of any one of Examples 1-11.

Example 28 includes a system comprising means to implement any one of Examples 1-11.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A system comprising:
a processor coupled to a memory, the memory comprising at least one non-volatile memory cell that is configured to store a charge in a gate and have a retention time that is within a statistical window around a selected lifespan, wherein the gate includes a control gate, and wherein the non-volatile memory cell is stressed by applying cycles of high voltage to the control gate of the non-volatile memory such that the charge is set to leak and continue to leak based on a predetermined amount or percentage over a predetermined amount of time based on the selected lifespan.

2. The system of claim 1, wherein the selected lifespan is less than ten years, wherein the cycles are applied such that properties of one or more isolators associated with the non-volatile memory cell are reduced to modify thickness of the one or more isolators, or one or more dopants in a channel region are added or removed to modify channel properties associated with a channel between a source and a drain.

3. The system of claim 1, wherein the statistical window is between 95% of the selected lifespan and 105% of the selected lifespan.

4. The system of claim 1, wherein the non-volatile memory cell is to store charge based on a control signal being applied thereto and is to leak the stored charge over time based on conductance of an oxide including a leaky gate oxide, and the selected lifespan indicates an amount of time that the stored charge is detectable in the non-volatile memory cell.

5. The system of claim 1, wherein the memory comprises a flash memory device and the memory cell is integrated in the flash memory device, wherein the gate includes a floating gate, and wherein the non-volatile memory cell includes a floating gate-based memory cell.

6. The system of claim 1, wherein the system comprises a system-on-chip (SoC).

7. An apparatus comprising:
a non-volatile memory cell including a sidewall storage-based non-volatile memory cell that is configured to have a retention time that is within a statistical window around a selected lifespan, wherein the non-volatile memory cell is configured to store a charge in a gate including a control gate, and wherein the non-volatile memory cell is stressed by applying cycles of high voltage to the control gate of the non-volatile memory such that the charge is set to leak and continue to leak based on a predetermined amount or percentage over a predetermined amount of time based on the selected lifespan.

8. The apparatus of claim 7, wherein the statistical window is between 95% of the selected lifespan and 105% of the selected lifespan wherein the cycles are applied such that properties of one or more isolators associated with the non-volatile memory cell are reduced to modify thickness of the one or more isolators, or one or more dopants in a channel region are added or removed to modify channel properties associated with a channel between a source and a drain.

9. The apparatus of claim 7, wherein the memory cell is to store a charge in the control gate based on a control signal being applied to the control gate, is to leak the stored charge over time based on conductance of an oxide including a leaky gate oxide, and the selected lifespan indicates an amount of time that the stored charge is detectable in the sidewall spacer.

10. The apparatus of claim 7, wherein the apparatus comprises a flash memory device and the memory cell is integrated in the flash memory device, wherein the gate includes a floating gate, and wherein the non-volatile memory cell includes a floating gate-based memory cell.

* * * * *